US012750041B2

(12) United States Patent
Seo et al.

(10) Patent No.: US 12,750,041 B2
(45) Date of Patent: Sep. 29, 2026

(54) CLOCK TRANSMISSION CIRCUIT AND SEMICONDUCTOR DEVICE INCLUDING THE SAME

(71) Applicant: SK hynix Inc., Gyeonggi-do (KR)

(72) Inventors: Beom Kyu Seo, Gyeonggi-do (KR); Bon Kwang Koo, Gyeonggi-do (KR); Soon Sung An, Gyeonggi-do (KR); Sung Hwa Ok, Gyeonggi-do (KR); Jun Seo Jang, Gyeonggi-do (KR); Eun Ji Choi, Gyeonggi-do (KR); Jae Hyeong Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 5 days.

(21) Appl. No.: 18/822,480

(22) Filed: Sep. 3, 2024

(65) Prior Publication Data

US 2025/0317129 A1 Oct. 9, 2025

(30) Foreign Application Priority Data

Apr. 4, 2024 (KR) ........................ 10-2024-0045887

(51) Int. Cl.

| | |
|---|---|
| ***H03K 3/037*** | (2006.01) |
| ***G06F 1/08*** | (2006.01) |
| ***G06F 1/12*** | (2006.01) |
| *G11C 7/22* | (2006.01) |

(52) U.S. Cl.

CPC ............... *H03K 3/037* (2013.01); *G06F 1/08* (2013.01); *G06F 1/12* (2013.01); *G11C 7/222* (2013.01)

(58) Field of Classification Search

CPC .. H03K 3/037; G06F 1/08; G06F 1/12; G11C 7/222

See application file for complete search history.

(56) References Cited

U.S. PATENT DOCUMENTS 6,707,727 B2 * 3/2004 Tamura ................ G11C 7/1069 365/236
2023/0019887 A1 1/2023 Yamashita et al.

FOREIGN PATENT DOCUMENTS

KR 10-0618695 B1 9/2006

OTHER PUBLICATIONS

Byoung-Joo Yoo et al., A 56Gb/s 7.7mW/GB/s PAM-4 Wireline Transceiver in 10nm FinFET Using MM-CDR-Based ADC Timing Skew Control and Low-Power DSP with Approximate Multiplier, ISSCC 2020 Session 6 Ultra High-Speed Wireline 6.4, Feb. 17, 2020, pp. 122-124, IEEE.

(Continued)

*Primary Examiner* — Menatoallah Youssef
*Assistant Examiner* — Colleen J O Toole
(74) *Attorney, Agent, or Firm* — IP&T GROUP LLP

(57) ABSTRACT

A clock transmission circuit comprising a first inverter configured to invert an input clock signal received through a clock input terminal to generate an inverted clock signal, and output the inverted clock signal to a clock output terminal, a feedback impedance circuit connected in parallel with the first inverter between the clock output terminal and the clock input terminal, and an inverter chain unit having a smaller size than the first inverter, including an odd number of second inverters connected in a chain form, connected to the clock output terminal, and configured to invert the inverted clock signal to generate an output clock signal and output the output clock signal to the clock output terminal.

22 Claims, 8 Drawing Sheets

(56) References Cited

OTHER PUBLICATIONS

Behzad Razavi, The Active Inductor [A Circuit for All Seasons], IEEE Solid-State Circuits Magazine, Jun. 23, 2020, pp. 7-11, vol. 12, Issue 2, IEEE.

* cited by examiner

CLOCK TRANSMISSION CIRCUIT AND SEMICONDUCTOR DEVICE INCLUDING THE SAME

CROSS-REFERENCE TO RELATED APPLICATION

This application claims priority under 35 U.S.C. § 119(a) to Korean Patent Application No. 10-2024-0045887, filed on Apr. 4, 2024, the entire contents of which are incorporated herein by reference.

BACKGROUND

1. Field

Various embodiments of the present disclosure relate to a semiconductor design, and more particularly, to a clock transmission circuit that can minimize propagation delay and a semiconductor device including the same.

2. Discussion of the Related Art

Electronic devices may include many electronic components. Among the electronic devices, a computer system may include many semiconductor devices made of semiconductors. The semiconductor devices constituting the computer system may communicate with each other by transmitting and receiving clock signals and data. With the recent improvement of the operating speeds of semiconductor devices, the frequency of a clock signal also increases.

A semiconductor device includes a clock distribution network such as a clock tree in order to distribute a clock signal to various internal circuits. The clock tree may supply the clock signal to various circuits inside the semiconductor device by driving the clock signal. However, as the frequency of the clock signal increases and the pulse width of the clock signal decreases, it becomes increasingly difficult to accurately supply the clock signal. The transmission timing of the clock signal may also be delayed. Various methods have been proposed in order to accurately drive and supply a clock signal, and a representative method is to drive the clock signal by performing a de-emphasis operation.

SUMMARY

Various embodiments of the present disclosure are directed to providing a clock transmission circuit that can minimize propagation delay through minimal circuit changes and a semiconductor device including the same.

Technical problems to be addressed in the present disclosure are not limited to the aforementioned technical problems and other unmentioned technical problems will be clearly understood by those skilled in the art from the following description.

In an embodiment of the present disclosure, a clock transmission circuit may include: a first inverter configured to invert an input clock signal received through a clock input terminal to generate an inverted clock signal, and output the inverted clock signal to a clock output terminal; a feedback impedance circuit connected in parallel with the first inverter between the clock output terminal and the clock input terminal; and an inverter chain unit having a smaller size than the first inverter, including an odd number of second inverters connected in a chain form, connected to the clock output terminal, and configured to invert the inverted clock signal to generate an output clock signal and output the output clock signal to the clock output terminal.

In an embodiment of the present disclosure, a semiconductor device may include: a first inverter configured to receive an input clock signal through a clock input terminal, invert the input clock signal to generate an inverted clock signal, and output the inverted clock signal to a clock output terminal, the input clock signal being input through a first interface; a feedback impedance circuit connected in parallel with the first inverter between the clock output terminal and the clock input terminal; an inverter chain unit having a smaller size than the first inverter, including an odd number of second inverters connected in a chain form, connected to the clock output terminal, and configured to invert the inverted clock signal to generate an output clock signal and output the output clock signal to the clock output terminal; and an output circuit configured to output an internal signal to a second interface in response to the output clock signal on the clock output terminal.

In an embodiment of the present disclosure, a clock transmission circuit may include: a first node and a second node with a set physical distance therebetween; and a transmission unit including first driving units and second driving units that are alternatively connected to each other in a chain form between the first node and the second node, and configured to transmit a clock signal through the first driving units and the second driving units. Each of the first driving units may include: a first inverter configured to invert a first input signal received through a first input terminal to generate an inverted first input signal, and output the inverted first input signal to a first output terminal; a feedback impedance circuit connected in parallel with the first inverter between the first output terminal and the first input terminal; and an inverter chain unit having a smaller size than the first inverter, including an odd number of second inverters connected in a chain form, connected to the first output terminal, and configured to invert the inverted first input signal to generate a first output signal and output the first output signal to the first output terminal. Each of the second driving units may include: a third inverter configured to invert a second input signal received through a second input terminal to generate an inverted first input signal and output the inverted second input signal to a second output terminal.

In an embodiment of the present disclosure, a semiconductor device may include: a reception unit configured to receive a clock signal input through a first interface; a transfer unit configured to transfer an internal signal to a second interface in response to the clock signal; and a transmission unit including first driving units and second driving units that are alternately connected to each other in a chain form, and configured to transmit the clock signal received from the reception unit to the transfer unit. Each of the first driving units may include: a first inverter configured to invert a first input signal received through a first input terminal to generate an inverted first input signal, and output the inverted first input signal to a first output terminal; a feedback impedance circuit connected in parallel with the first inverter between the first output terminal and the first input terminal; and an inverter chain unit having a smaller size than the first inverter, including an odd number of second inverters connected in a chain form, connected to the first output terminal, and configured to invert the inverted first input signal to generate a first output signal and output the first output signal to the first output terminal. Each of the second driving units may include: a third inverter configured to invert a second input signal received through a second input terminal to generate an inverted first input signal and output the inverted second input signal to a second output terminal.

Embodiments of the present disclosure can add a feedback impedance and an inverter chain only to some (odd-numbered or even-numbered inverters) of a plurality of transmission inverters connected in a chain form in a long path when a clock signal is transmitted through the plurality of transmission inverters, thereby minimizing propagation delay required through the long path.

DETAILED DESCRIPTION

Figure 1A:
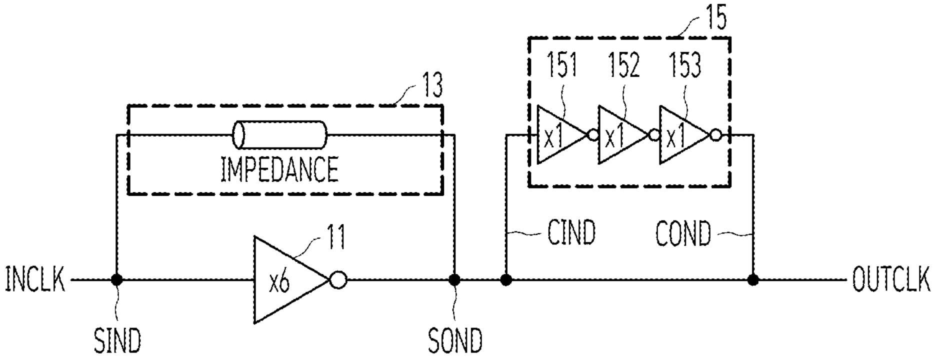
FIGS. 1A to 1C illustrate a clock transmission circuit in accordance with a first embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Figure 1B:
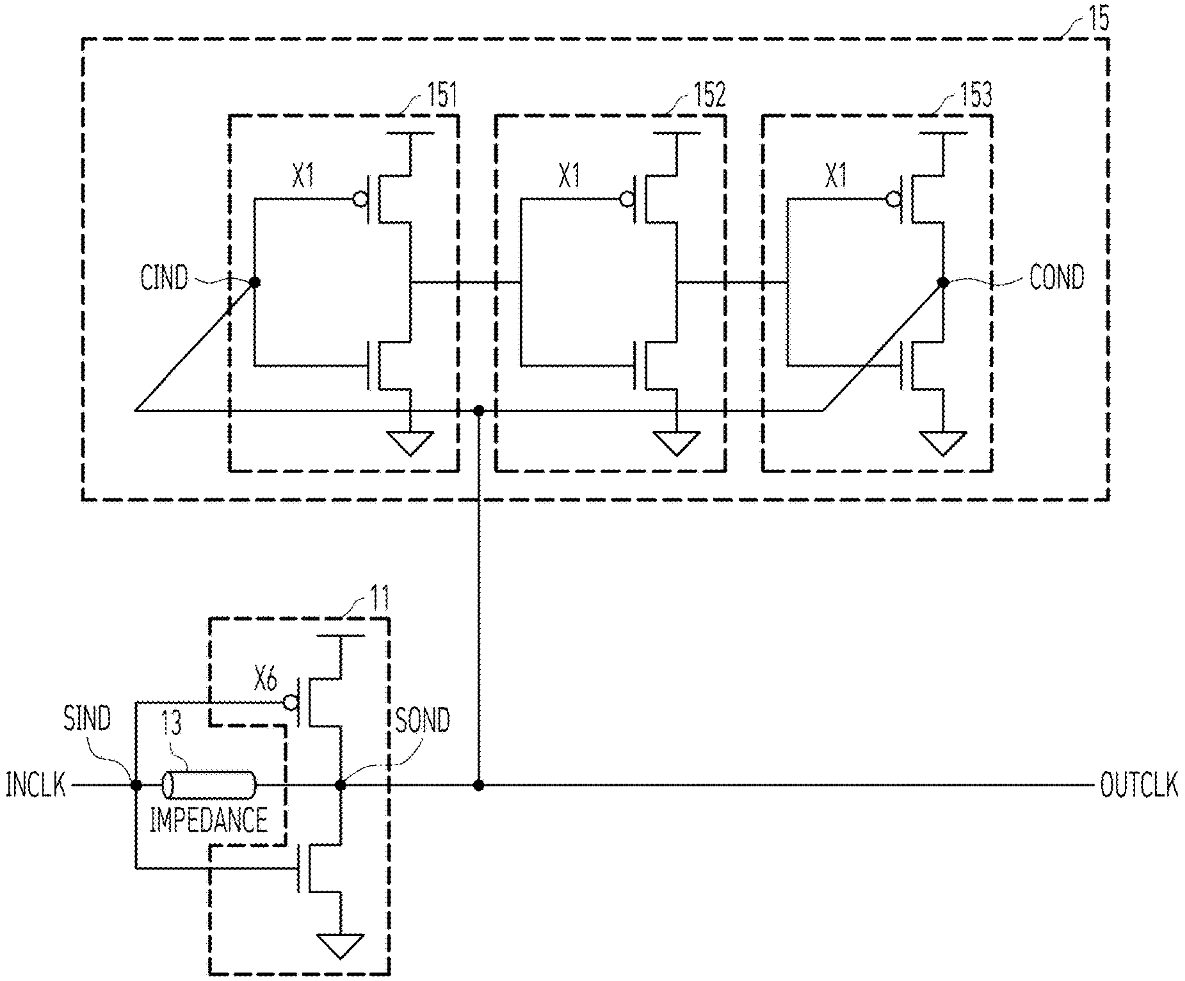
Figure 1C:
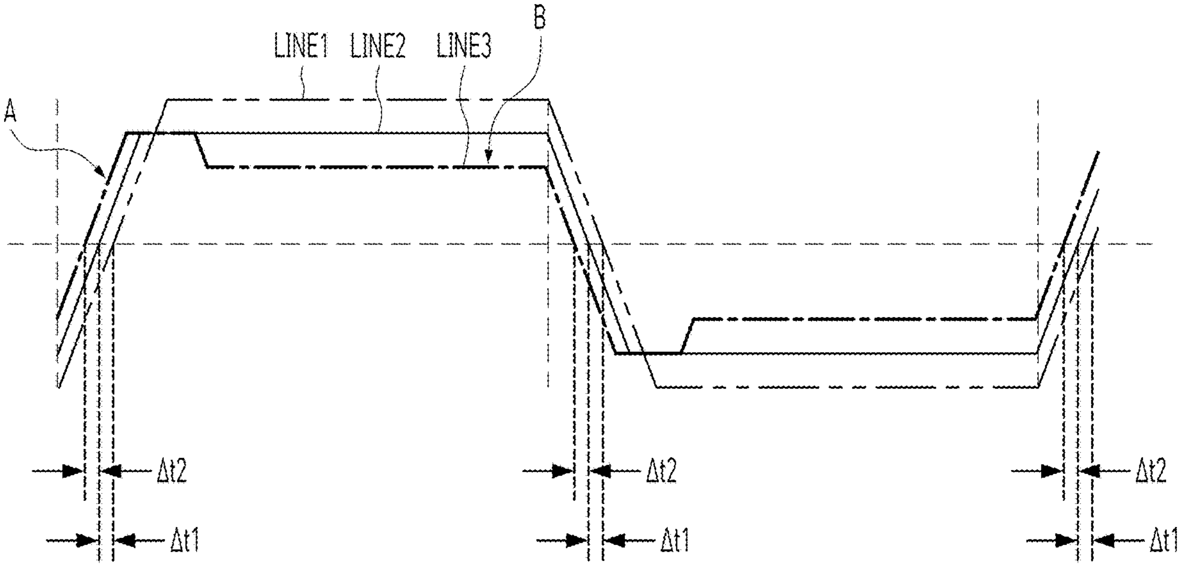

FIGS. 1A to 1C illustrate a clock transmission circuit in accordance with a first embodiment of the present disclosure.

Referring to FIGS. 1A and 1B, the clock transmission circuit may include a first inverter 11, a feedback impedance circuit 13, and an inverter chain unit 15.

FIGS. 1A and 1B are diagrams illustrating the same clock transmission circuit in different forms, as can be seen from the use of the same reference numerals. Accordingly, the configuration and operation of the clock transmission circuit to be described below may be applied in common to FIGS. 1A and 1B.

First, the clock transmission circuit may transmit clock signals INCLK and OUTCLK that toggle at a frequency set inside a semiconductor device. The semiconductor device may refer to an integrated circuit (IC) disk individually cut (sawed) on a semiconductor wafer. That is, the clock transmission circuit illustrated in the drawing may include a circuit for transmitting the clock signals INCLK and OUTCLK inside one semiconductor chip or one semiconductor die physically separated.

Specifically, the clock transmission circuit may transmit an input clock signal INCLK in a set transmission direction, for example, from left to right in the drawing, thereby outputting the input clock signal INCLK as an output clock signal OUTCLK.

The first inverter 11 included in the clock transmission circuit may invert the input clock signal INCLK received through a clock input terminal SIND. The inverted clock signal may be outputted as the output clock signal OUTCLK to drive a clock output terminal SOND.

The feedback impedance circuit 13 included in the clock transmission circuit may be connected in parallel with the first inverter 11 between the clock output terminal SOND and the clock input terminal SIND.

In this way, as compared to the output clock signal OUTCLK output from the clock output terminal SOND in a state in which only the first inverter 11 is connected between the clock input terminal SIND and the clock output terminal SOND, the output clock signal OUTCLK may be output from the clock output terminal SOND in a state in which the feedback impedance circuit 13 and the first inverter 11 are connected in parallel between the clock input terminal SIND and the clock output terminal SOND. The output clock signal OUTCLK may have a swing level that is relatively further reduced, may have a rising time (time required for rising edge) and a falling time (time required for falling edge) that are relatively further reduced, and may have a 3-dB bandwidth that is relatively wider at the same time.

In such a case, the impedance value of the feedback impedance circuit 13 may vary depending on how a process of a semiconductor device including the clock transmission circuit is performed. For example, the impedance of the feedback impedance circuit 13 may include a feedback resistance, and the value of the feedback resistance may be 3 kiloohms (kΩ). Depending on how the process of the semiconductor device including the clock transmission circuit is performed, the value of the feedback resistance may be set to a value greater or less than 3 kΩ. The inverter chain unit 15 included in the clock transmission circuit may have a smaller size than the first inverter 11, and include an odd number of second inverters 151 to 153 connected in a chain form. In such a case, the inverter chain unit 15 may be connected to the clock output terminal SOND. In such a case, an input terminal CIND and an output terminal COND of the inverter chain unit 15 may be connected in common to the clock output terminal SOND.

The size of the first inverter 11 may be six times greater than the size of each of the second inverters 151 to 153. In order to express this size difference, the inside of the first inverter 11 is marked as ‘x6’ and the inside of each of the second inverters 151 to 153 is marked as ‘x1’ in the drawing.

In some embodiments, the limitation that the size of the first inverter 11 is six times greater than the size of each of the second inverters 151 to 153 is merely an example. Alternatively, it is entirely possible to have sizes with other multiples.

The number of second inverters 151 to 153 included in the inverter chain unit 15 may be an odd number. The number of second inverters 151 to 153 included in the inverter chain unit 15 may also be an odd number of at least three.

In this way, as compared to the output clock signal OUTCLK output from the clock output terminal SOND in a state in which only the first inverter 11 is connected between the clock input terminal SIND and the clock output terminal SOND, the output clock signal OUTCLK may be output from the clock output terminal SOND in a state in which the inverter chain unit 15 including an odd number of second inverters 151 to 153 is connected to the clock output terminal SOND. The output clock signal OUTCLK may be further subjected to a de-emphasis operation to have the rising time (time required for rising edge) and the falling time (time required for falling edge) that are relatively further reduced.

In summary, as compared to the output clock signal OUTCLK output from the clock output terminal SOND in a state in which only the first inverter 11 is connected between the clock input terminal SIND and the clock output terminal SOND, the output clock signal OUTCLK may be output from the clock output terminal SOND in a state in which the feedback impedance circuit 13 is connected in parallel with the first inverter 11 between the clock input terminal SIND and the clock output terminal SOND and at the same time, the inverter chain unit 15 including an odd number of second inverters 151 to 153 is connected to the clock output terminal SOND. The output clock signal OUTCLK may have a swing level that is relatively further reduced, may be further subjected to a de-emphasis operation at the same time, and thus may have the rising time (time required for rising edge) and the falling time (time required for falling edge) that are relatively further reduced and a 3-dB bandwidth that is relatively wider at the same time.

This means that the amount of delay, which is required for transmitting the input clock signal INCLK as the output clock signal OUTCLK in a state in which only the first inverter 11 is connected between the clock input terminal SIND and the clock output terminal SOND, may be relatively greater than the amount of delay required for transmitting the input clock signal INCLK as the output clock signal OUTCLK in a state in which the feedback impedance circuit 13 is connected in parallel with the first inverter 11 between the clock input terminal SIND and the clock output terminal SOND and at the same time, the inverter chain unit 15 including an odd number of second inverters 151 to 153 is connected to the clock output terminal SOND.

That is, the clock transmission circuit in accordance with the first embodiment of the present invention further connects the feedback impedance circuit 13 together with the first inverter 11 between the clock input terminal SIND and the clock output terminal SOND, and further connects the inverter chain unit 15 to the clock output terminal SOND, thereby minimizing the amount of delay required for transmitting the input clock signal INCLK as the output clock signal OUTCLK, that is, propagation delay.

For example, in a case of transmitting the clock signals INCLK and OUTCLK used inside a semiconductor device operating at 4.8 Gigabits per second (Gbps), when the feedback impedance circuit 13 is further connected together with the first inverter 11 between the clock input terminal SIND and the clock output terminal SOND and the inverter chain unit 15 is further connected to the clock output terminal SOND, propagation delay can be further reduced by 6.4 picoseconds (ps) to 14.1 ps compared to when only the first inverter 11 is connected between the clock input terminal SIND and the clock output terminal SOND.

Referring to FIG. 1C, the output clock signal OUTCLK output from the clock output terminal SOND in a state in which only the first inverter 11 is connected between the clock input terminal SIND and the clock output terminal SOND may have the same form as LINE1.

The output clock signal OUTCLK output from the clock output terminal SOND in a state in which the feedback impedance circuit 13 and the first inverter 11 are connected in parallel between the clock input terminal SIND and the clock output terminal SOND may have the same form as LINE2. In such a case, compared to LINE1, due to the presence of the feedback impedance circuit 13, LINE2 may have a relatively small swing level and thus have a difference of Δt1 in the rising time (time required for rising edge) and falling time (time required for falling edge).

In addition, the output clock signal OUTCLK, which is output from the clock output terminal SOND in a state in which the IMPEDANCE 13 is connected in parallel with the first inverter 11 between the clock input terminal SIND and the clock output terminal SOND and at the same time, the inverter chain unit 15 including an odd number of second inverters 151 to 153 is connected to the clock output terminal SOND, may have the same form as LINE3. In such a case, compared to LINE1, due to the presence of the feedback impedance circuit 13, LINE3 may have a relatively small swing level and thus have a difference of Δt1 in the rising time (time required for rising edge) and falling time (time required for falling edge). Moreover, due to the presence of the second inverters 151 to 153, a voltage level may move (falls or rises) in advance in a section B between a previous transition operation (rising edge or falling edge) and a next transition operation (falling edge or rising edge) and prepare for a next transition operation (falling edge or rising edge), so that LINE3 may have a difference of Δt2 in the rising time (time required for rising edge) and falling time (time required for falling edge). That is, compared to LINE1, LINE3 may have a difference of Δt1+Δt2 in the rising time (time required for rising edge) and falling time (time required for falling edge).

In a form in which only the feedback impedance circuit 13 is connected together with the first inverter 11 between the clock input terminal SIND and the clock output terminal SOND, that is, in a first form in which the inverter chain unit 15 does not exist and only the value of the feedback impedance circuit 13 is adjusted, since the swing level of the output clock signal OUTCLK is reduced too much, propagation delay may not be reduced beyond a certain level.

Likewise, in a form in which only the inverter chain unit 15 is connected together with the first inverter 11 between the clock input terminal SIND and the clock output terminal SOND, that is, in a second form in which the feedback impedance circuit 13 does not exist and only the sizes of the inverters 151 to 153 included in the inverter chain unit 15 are adjusted, since a de-emphasis operation is applied too excessively, propagation delay may not be reduced beyond a certain level.

On the other hand, as in the clock transmission circuit in accordance with the first embodiment of the present invention, when the feedback impedance circuit 13 is further connected together with the first inverter 11 between the clock input terminal SIND and the clock output terminal SOND and the inverter chain unit 15 is further connected to the clock output terminal SOND, since the degree to which the swing level of the output clock signal OUTCLK is reduced and the degree to which the de-emphasis operation is applied can be applied complementary to each other, the propagation delay can be reduced more than in the case of the first form and the second form described above.

Figure 2:
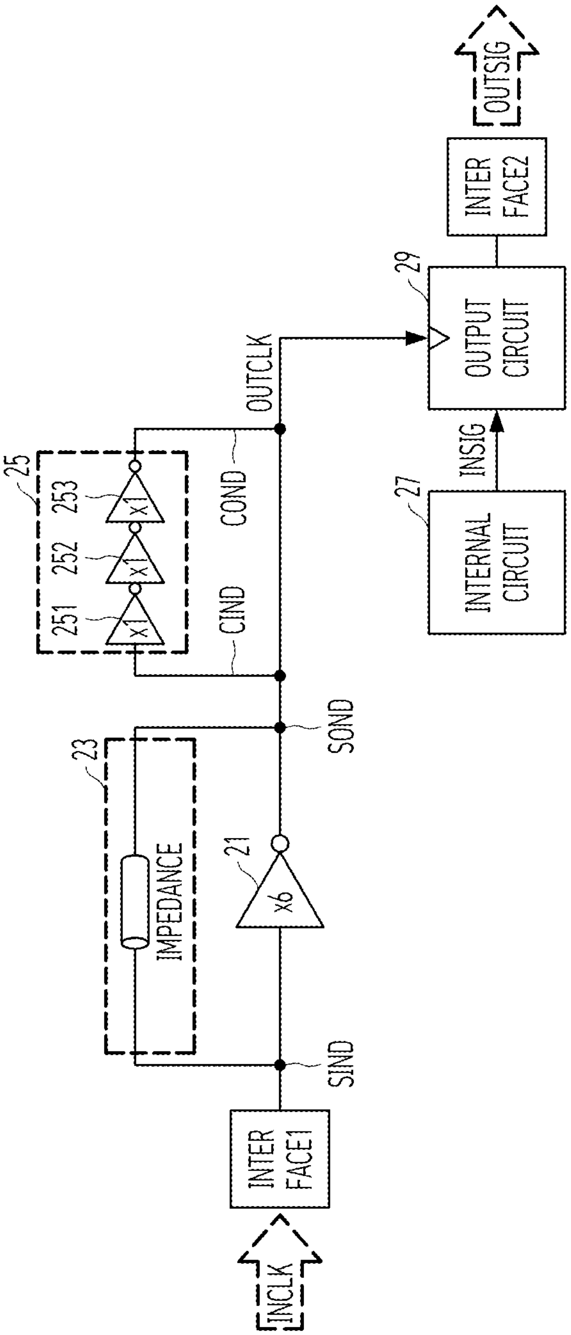
FIG. 2 illustrates a semiconductor device in accordance with a second embodiment of the present disclosure.

FIG. 2 illustrates a semiconductor device in accordance with a second embodiment of the present invention.

Referring to FIG. 2, the semiconductor device may include a first interface INTERFACE1, a second interface INTERFACE2, a first inverter 21, a feedback impedance circuit 23, an inverter chain unit 25, an internal circuit 27, and an output circuit 29.

The semiconductor device may refer to an integrated circuit (IC) disk individually cut (sawed) on a semiconductor wafer. That is, the semiconductor device may mean one semiconductor chip or one semiconductor die physically separated.

The INTERFACE1 and the INTERFACE2 may refer to pads or pins for inputting/outputting signals in the semiconductor device.

The first inverter 21, the feedback impedance circuit 23, and the inverter chain unit 25 included in the semiconductor device may invert an input clock signal INCLK, which is input to the INTERFACE1, to generate an output clock signal OUTCLK, and transmit the output clock signal OUTCLK to the output circuit 29.

The internal circuit 27 included in the semiconductor device may generate an internal signal INSIG by performing a set operation. The set operation performed by the internal circuit 27 may vary depending on the purpose for which the semiconductor device is used. For example, the semiconductor device may be a memory device for storing data, and the set operation may include a read operation of outputting data stored inside the memory device.

The output circuit 29 included in the semiconductor device may synchronize the internal signal INSIG generated by the internal circuit 27 to a predetermined edge of the output clock signal OUTCLK, and output the synchronized internal signal INSIG to the INTERFACE2. Specifically, the INTERFACE1 and the INTERFACE2 may be physically separated from each other by a predetermined distance within the semiconductor device. That is, the input clock signal INCLK received through the INTERFACE1 may be transmitted over at least a physically predetermined distance and then applied to the output circuit 29 as the output clock signal OUTCLK.

The first inverter 21 included in the semiconductor device may receive the input clock signal INCLK, which is input through the INTERFACE1, through a clock input terminal SIND. Further, the first inverter 21 may invert the input clock signal INCLK to generate the inverted input clock signal, and may output the inverted input clock signal to a clock output terminal SOND.

The feedback impedance circuit 23 included in the semiconductor device may be connected in parallel with the first inverter 21 between the clock output terminal SOND and the clock input terminal SIND.

In this way, as compared to the output clock signal OUTCLK output from the clock output terminal SOND in a state in which only the first inverter 21 is connected between the clock input terminal SIND and the clock output terminal SOND, the output clock signal OUTCLK may be output from the clock output terminal SOND in a state in which the feedback impedance circuit 23 and the first inverter 21 are connected in parallel between the clock input terminal SIND and the clock output terminal SOND. The output clock signal OUTCLK may have a swing level that is relatively further reduced, may have a rising time (time required for rising edge) and a falling time (time required for falling edge) that are relatively further reduced, and may have a 3-dB bandwidth that is relatively wider, all at the same time.

In such a case, the impedance value of the output clock signal OUTCLK 23 may vary depending on how a process of the semiconductor device including the clock transmission circuit is performed. For example, the impedance of the feedback impedance circuit 23 may include a feedback resistance, and the value of the feedback resistance may be 3 k. Depending on how the process of the semiconductor device including the clock transmission circuit is performed, the value of the feedback resistance can be set to a value greater or less than 3 kΩ.

The inverter chain unit 25 included in the semiconductor device may have a smaller size than the first inverter 21, and may include an odd number of second inverters 251 to 253 connected in a chain form. In such a case, the inverter chain unit 25 may be connected to the clock output terminal SOND. In such a case, an input terminal CIND and an output terminal COND of the inverter chain unit 25 may be connected in common to the clock output terminal SOND.

The size of the first inverter 21 may be six times greater than the size of each of the second inverters 251 to 253. In order to express this size difference, the inside of the first inverter 21 is marked as 'x6' and the inside of each of the second inverters 251 to 253 is marked as 'x1' in the drawing.

In some embodiments, the limitation that the size of the first inverter 21 is six times greater than the size of each of the second inverters 251 to 253 is merely an example. Alternatively, it is entirely possible to have sizes with other multiples.

The number of second inverters 251 to 253 included in the inverter chain unit 25 may be an odd number. The number of second inverters 251 to 253 included in the inverter chain unit 25 may also be an odd number of at least three.

In this way, as compared to the output clock signal OUTCLK output from the clock output terminal SOND in a state in which only the first inverter 21 is connected between the clock input terminal SIND and the clock output terminal SOND, the output clock signal OUTCLK may be output from the clock output terminal SOND in a state in which the inverter chain unit 25 including an odd number of second inverters 251 to 253 is connected to the clock output terminal SOND. The output clock signal OUTCLK may be further subjected to a de-emphasis operation to have the rising time (time required for rising edge) and the falling time (time required for falling edge) that are relatively further reduced.

In summary, as compared to the output clock signal OUTCLK output from the clock output terminal SOND in a state in which only the first inverter 21 is connected between the clock input terminal SIND and the clock output terminal SOND, the output clock signal OUTCLK may be output from the clock output terminal SOND in a state in which the feedback impedance circuit 23 is connected in parallel with the first inverter 21 between the clock input terminal SIND and the clock output terminal SOND and at the same time, the inverter chain unit 25 including an odd number of second inverters 251 to 253 is connected to the clock output terminal SOND. The output clock signal OUTCLK may have a swing level that is relatively further reduced, may be further subjected to a de-emphasis operation at the same time, and thus may have the rising time (time required for rising edge) and the falling time (time required for falling edge) that are relatively further reduced and a 3-dB bandwidth that is relatively wider, all at the same time.

This means that the amount of delay, which is required for transmitting the input clock signal INCLK as the output clock signal OUTCLK in a state in which only the first inverter 21 is connected between the clock input terminal SIND and the clock output terminal SOND, may be relatively greater than the amount of delay required for transmitting the input clock signal INCLK as the output clock signal OUTCLK in a state in which the feedback impedance circuit 23 is connected in parallel with the first inverter 21 between the clock input terminal SIND and the clock output terminal SOND and at the same time, the inverter chain unit 25 including an odd number of second inverters 251 to 253 is connected to the clock output terminal SOND.

That is, the clock transmission circuit in accordance with the second embodiment of the present invention further connects the feedback impedance circuit 23 together with the first inverter 21 between the clock input terminal SIND and the clock output terminal SOND, and further connects the inverter chain unit 25 to the clock output terminal SOND, thereby minimizing the amount of delay required for transmitting the input clock signal INCLK as the output clock signal OUTCLK, that is, propagation delay.

For example, in a case where the semiconductor device operates at 408 Gbps and the clock signals INCLK and OUTCLK are transmitted from the INTERFACE1 to the output circuit 29, when the feedback impedance circuit 23 is connected together with the first inverter 21 between the clock input terminal SIND and the clock output terminal SOND and the inverter chain unit 25 is further connected to the clock output terminal SOND, propagation delay can be further reduced by 6.4 ps to 14.1 ps compared to when only the first inverter 21 is connected between the clock input terminal SIND and the clock output terminal SOND.

The output clock signal OUTCLK, which is output from the clock output terminal SOND in a state in which the feedback impedance circuit 23 is connected in parallel with the first inverter 21 between the clock input terminal SIND and the clock output terminal SOND and at the same time, the inverter chain unit 25 including an odd number of second inverters 251 to 253 is connected to the clock output terminal SOND, may have the same form as LINE3 illustrated in FIG. 1C. That is, even in FIG. 2, the output clock signal OUTCLK corresponding to when only the first inverter 21 is connected between the clock input terminal SIND and the clock output terminal SOND (i.e., when the feedback impedance circuit 23 and the inverter chain unit 25 are not connected) may have the same form as LINE1 illustrated in FIG. 1C, and the output clock signal OUTCLK corresponding to when only the feedback impedance circuit 23 is connected together with the first inverter 21 between the clock input terminal SIND and the clock output terminal SOND (i.e., when the inverter chain unit 25 is not connected) may have the same form as LINE2 illustrated in FIG. 1C.

Figure 3A:
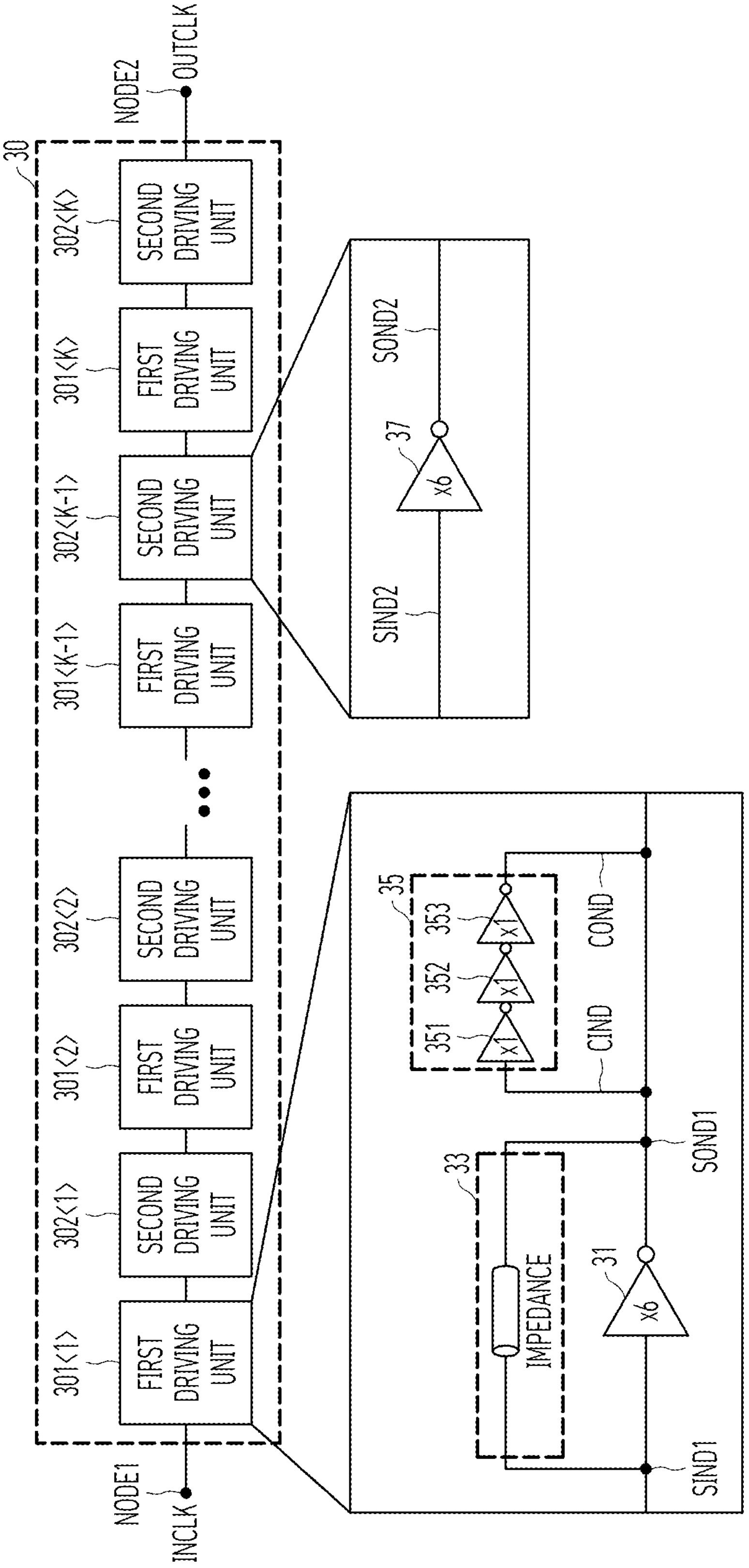
FIGS. 3A and 3B illustrate a clock transmission circuit that transmits a clock signal through a long path in accordance with a third embodiment of the present disclosure.
Figure 3B:
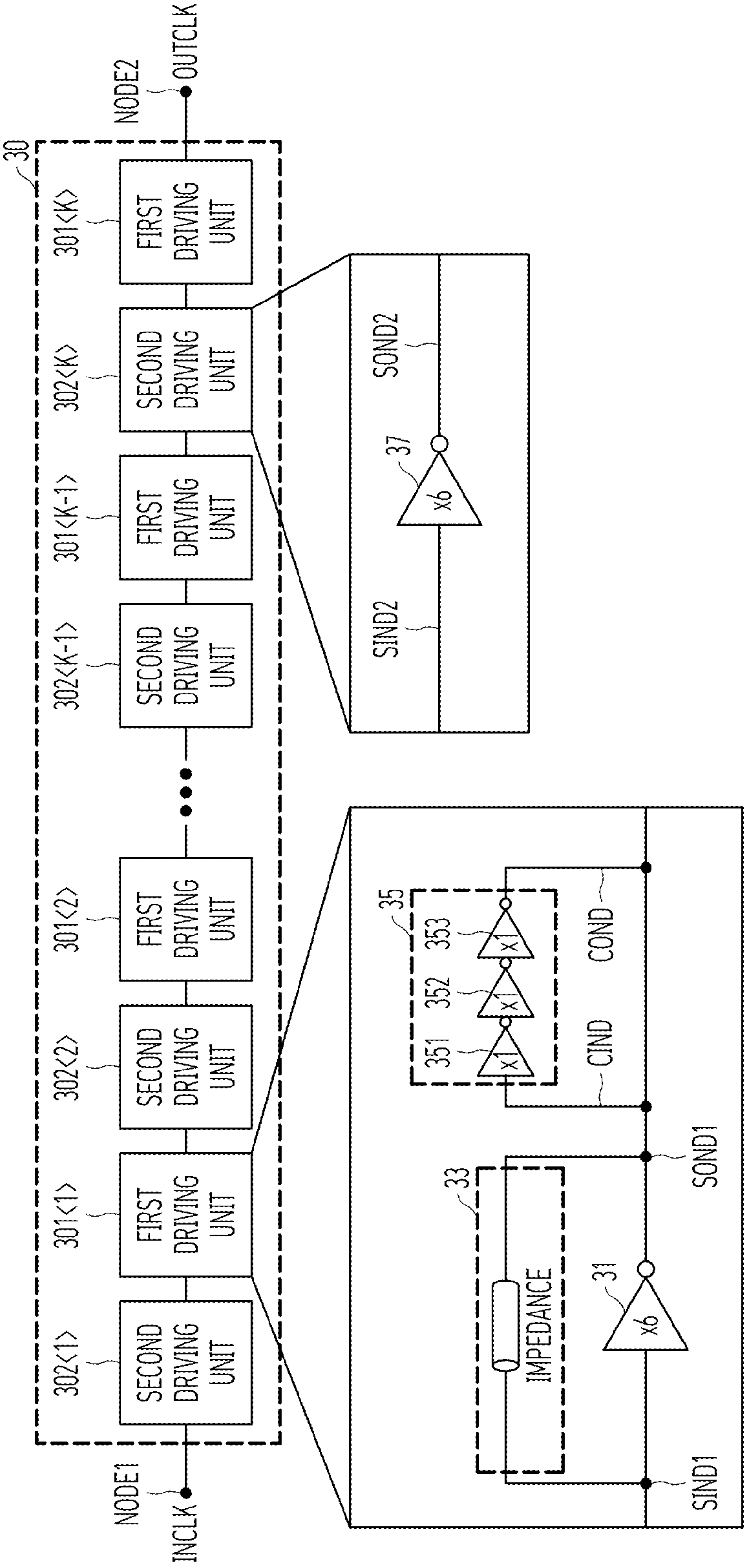

FIGS. 3A and 3B illustrate a clock transmission circuit that transmits a clock signal through a long path, in accordance with a third embodiment of the present disclosure.

Referring to FIGS. 3A and 3B, the clock transmission circuit may include a transmission unit 30 that transmits clock signals INCLK and OUTCLK through first driving units 301<1:K> and second driving units 302<1:K> that are alternately connected to each other in a chain form between a first node NODE1 and a second node NODE2 with a set physical distance therebetween. In such a case, K may be a natural number of 1 or more.

The clock transmission circuit may include a circuit for transmitting the clock signals INCLK and OUTCLK that toggle at a frequency set inside a semiconductor device. In such a case, the semiconductor device may refer to an integrated circuit (IC) disk individually cut (sawed) on a semiconductor wafer. That is, the clock transmission circuit illustrated in FIGS. 3A and 3B may be a circuit for transmitting the clock signals INCLK and OUTCLK within one semiconductor chip or one semiconductor die physically separated.

Specifically, the transmission unit 30 included in the clock transmission circuit may transmit the input clock signal INCLK from the first node NODE1 to the second node NODE2, thereby outputting the input clock signal INCLK as the output clock signal OUTCLK. In such a case, the first node NODE1 and the second node NODE2 may be physically separated from each other by a predetermined distance within the semiconductor device. That is, the input clock signal INCLK transferred on the first node NODE1 may be transmitted over a physically predetermined distance and then transferred on the second node NODE2 as the output clock signal OUTCLK. In this way, the first node NODE1 and the second node NODE2 are separated by a predetermined distance, and this is defined as transmitting the clock signals INCLK and OUTCLK through a long path.

The transmission unit 30 may include the first driving units 301<1:K> and the second driving units 302<1:K>. The first driving units 301<1:K> and the second driving units 302<1:K> may be alternately connected to each other in a chain form.

In accordance with an embodiment, as illustrated in FIG. 3A, the transmission unit 30 may transmit, to the second node NODE2, the input clock signal INCLK transferred on the first node NODE1 through the first driving units 301<1:K> in an odd-numbered order and the second driving units 302<1:K> in an even-numbered order that are connected in a chain form, thereby outputting the input clock signal INCLK as the output clock signal OUTCLK.

In accordance with another embodiment, as illustrated in FIG. 3B, the transmission unit 30 may transmit, to the second node NODE2, the input clock signal INCLK transferred on the first node NODE1 through the first driving unit 301<1:K> in an even-numbered order and the second driving units 302<1:K> in an odd-numbered order that are connected in a chain form, thereby outputting the input clock signal INCLK as the output clock signal OUTCLK.

More specifically, the first driving units 301<1:K> included in the transmission unit 30 may each include a first inverter 31, a feedback impedance circuit 33, and an inverter chain unit 35.

The first inverter 31 included in each of the first driving units 301<1:K> may invert the input clock signal INCLK received through a first input terminal SIND1 to generate the inverted input clock signal INCLK. The inverted input clock signal INCLK may be outputted and driven to a first output terminal SOND1.

The feedback impedance circuit 33 included in each of the first driving units 301<1:K> may be connected in parallel with the first inverter 31 between the first output terminal SOND1 and the first input terminal SIND1.

The inverter chain unit 35 included in each of the first driving units 301<1:K> may have a smaller size than the first inverter 31, and include an odd number of second inverters 351 to 353 connected in a chain form. In such a case, the inverter chain unit 35 may be connected to the first output terminal SOND1. That is, an input terminal CIND and an output terminal COND of the inverter chain unit 35 may be connected in common to the first output terminal SOND1.

The number of second inverters 351 to 353 included in the inverter chain unit 35 may be an odd number. The number of second inverters 351 to 353 included in the inverter chain unit 35 may also be an odd number of at least three.

The second driving units 302<1:K> included in the transmission unit 30 may each include a third inverter 37.

The size of the third inverter 37 may be the same as that of the first inverter 31. That is, like the first inverter 31, the size of the third inverter 37 may be six times greater than the size of each of the second inverters 351 to 353. In order to express this size difference, the inside of each of the first inverter 31 and the third inverter 37 is marked as 'x6' and the inside of each of the second inverters 351 to 353 is marked as 'x1' in the drawing.

The limitation that the size of each of the first inverter 31 and the third inverter 37 is six times greater than the size of each of the second inverters 351 to 353 is merely an example. Alternatively, it is entirely possible to have sizes with other multiples.

On the other hand, it can be seen that the first inverter 31, the feedback impedance circuit 33, and the inverter chain unit 35 included in each of the first driving units 301<1:K> have the same configurations as those of the first inverter 11, the feedback impedance circuit 13, and the inverter chain unit 15 included in the clock transmission circuit disclosed in FIGS. 1A and 1B described above. That is, the clock transmission circuit in accordance with the third embodiment of the present invention may be designed so that the configuration of the first driving units 301<1:K> and the second driving units 302<1:K> alternately connected to each other in a chain form in the long path between the first node NODE1 and the second node NODE2 is the same as the configuration of the clock transmission circuit disclosed in FIGS. 1A and 1B. Through this, the amount of delay required for transmitting the input clock signal INCLK as the output clock signal OUTCLK in the long path between the first node NODE1 and the second node NODE2, that is, propagation delay can be minimized.

The specific operation and configuration of the components included in each of the first driving units 301<1:K> may refer to the configuration and operation of the clock transmission circuit disclosed in FIGS. 1A to 1C.

Figure 4A:
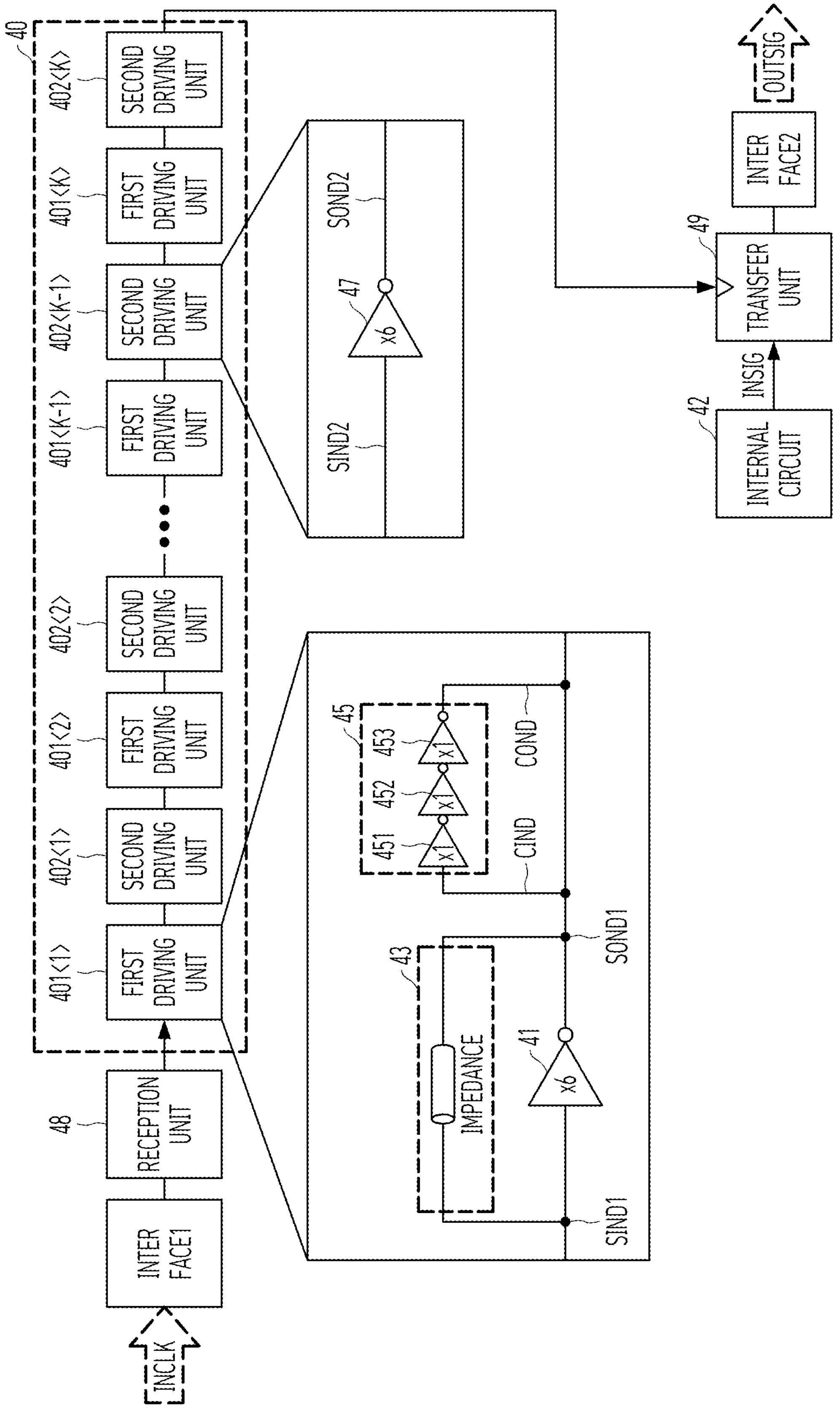
FIGS. 4A and 4B illustrate a semiconductor device that transmits a clock signal through a long path in accordance with a third embodiment of the present disclosure.
Figure 4B:
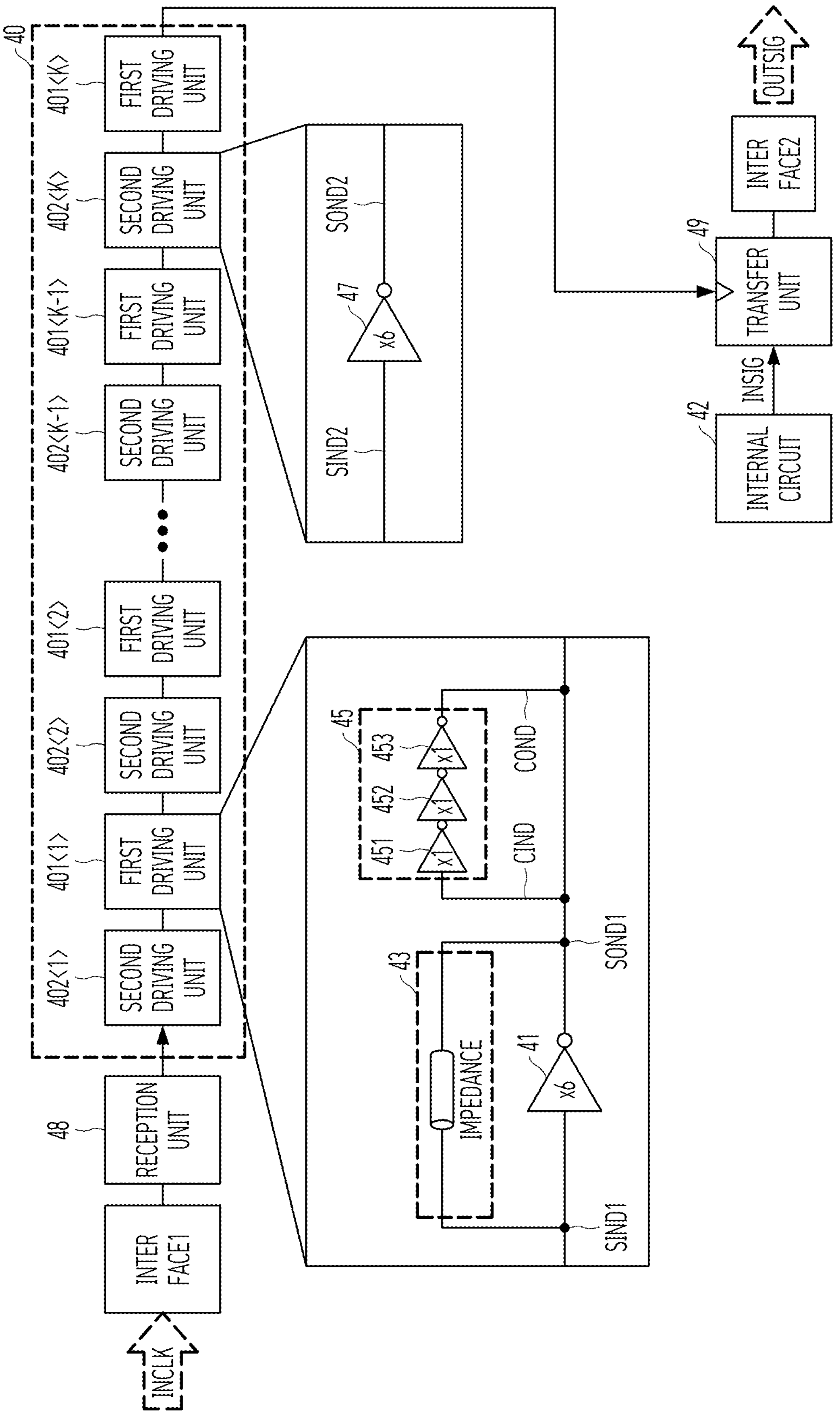

FIGS. 4A and 4B illustrate a semiconductor device that transmits a clock signal through a long path, in accordance with a fourth embodiment of the present disclosure.

Referring to FIGS. 4A and 4B, the semiconductor device may include a first interface INTERFACE1, a second interface INTERFACE2, a reception unit 48, a transfer unit 49, and a transmission unit 40.

The semiconductor device may refer to an integrated circuit (IC) disk individually cut (sawed) on a semiconductor wafer. That is, the semiconductor device may mean one semiconductor chip or one semiconductor die physically separated.

The transmission unit 40 included in the semiconductor device may transmit an input clock signal INCLK received from the reception unit 48 through first driving units 401<1:K> and second driving units 402<1:K> alternately connected to each other in a chain form, thereby inputting the input clock signal INCLK to the transfer unit 49 as an output clock signal OUTCLK. In such a case, K may be a natural number of 1 or more.

The INTERFACE1 and the INTERFACE2 included in the semiconductor device may refer to pads or pins for inputting/outputting signals from the semiconductor device.

The reception unit 48 included in the semiconductor device may receive the input clock signal INCLK input through the INTERFACE1.

An internal circuit 42 included in the semiconductor device may generate an internal signal INSIG by performing a set operation. The set operation performed by the internal circuit 42 may vary depending on the purpose for which the semiconductor device is used. For example, the semiconductor device may be a memory device for storing data, and the set operation may be a read operation of outputting data stored inside the memory device.

The transfer unit 49 included in the semiconductor device may synchronize the internal signal INSIG generated by the internal circuit 42 to a predetermined edge of the output clock signal OUTCLK, and output the synchronized internal signal INSIG to the INTERFACE2.

Specifically, the reception unit 48 and the transfer unit 49 may be physically separated from each other by a predetermined distance within the semiconductor device. That is, the transmission unit 40 may transmit the input clock signal INCLK received through the reception unit 48 over at least a physically predetermined distance, and then input the input clock signal INCLK to the transfer unit 49 as the output clock signal OUTCLK. In this way, the reception unit 48 and the transfer unit 49 are separated by a predetermined distance, and this is defined as transmitting the clock signals INCLK and OUTCLK through a long path.

The transmission unit 40 may include the first driving units 401<1:K> and the second driving units 402<1:K>. The first driving units 401<1:K> and the second driving units 402<1:K> may be alternately connected to each other in a chain form.

In accordance with an embodiment, as illustrated in FIG. 4A, the transmission unit 40 may transmit, to the transfer unit 49, the input clock signal INCLK received by the reception unit 48 as the output clock signal OUTCLK through the first driving units 401<1:K> in an odd-numbered order and the second driving units 402<1:K> in an even-numbered order that are connected in a chain form.

In accordance with another embodiment, as illustrated in FIG. 4B, the transmission unit 40 may transmit, to the transfer unit 49, the input clock signal INCLK received by the reception unit 48 as the output clock signal OUTCLK through the first driving units 401<1:K> in an even-numbered order and the second driving units 402<1:K> in an odd-numbered order that are connected in a chain form.

More specifically, each of the first driving units 401<1:K> included in the transmission unit 40 may include a first inverter 41, a feedback impedance circuit 43, and an inverter chain unit 45.

The first inverter 41 included in each of the first driving units 401<1:K> may invert the input clock signal INCLK received through a first input terminal SIND1 to generate the inverted input clock signal INCLK. The inverted input clock signal INCLK may be outputted and driven to a first output terminal SOND1.

The feedback impedance circuit 43 included in each of the first driving units 401<1:K> may be connected in parallel with the first inverter 41 between the first output terminal SOND1 and the first input terminal SIND1.

The inverter chain unit 45 included in each of the first driving units 401<1:K> may have a smaller size than the first inverter 41, and include an odd number of second inverters 451 to 453 connected in a chain form. In such a case, the inverter chain unit 45 may be connected to the first output terminal SOND1. That is, an input terminal CIND and an output terminal COND of the inverter chain unit 45 may be connected in common to the first output terminal SOND1.

The number of second inverters 451 to 453 included in the inverter chain unit 45 may be an odd number. The number of second inverters 451 to 453 included in the inverter chain unit 45 may also be an odd number of at least three Each of the second driving units 402<1:K> included in the transmission unit 40 may include a third inverter 47.

The size of the third inverter 47 may be the same as that of the first inverter 41. That is, like the first inverter 41, the size of the third inverter 47 may be six times greater than the size of each of the second inverters 451 to 453. In order to express this size difference, the inside of each of the first inverter 41 and the third inverter 47 is marked as 'x6' and the inside of each of the second inverters 451 to 453 is marked as 'x1' in the drawing.

The limitation that the size of each of the first inverter 41 and the third inverter 47 is six times greater than the size of each of the second inverters 451 to 453 is merely an example. Alternatively, it is entirely possible to have sizes with other multiples.

On the other hand, it can be seen that the first inverter 41, the feedback impedance circuit 43, and the inverter chain unit 45 included in each of the first driving units 401<1:K> have the same configurations as those of the first inverter 11, the feedback impedance circuit 13, and the inverter chain unit 15 included in the clock transmission circuit disclosed in FIGS. 1A and 1B described above. That is, the clock transmission circuit in accordance with the fourth embodiment of the present invention may be designed so that the configuration of the first driving units 401<1:K> and the second driving units 402<1:K> alternately connected to each other in a chain form in the long path between the reception unit 48 and the transfer unit 49 is the same as the configuration of the clock transmission circuit disclosed in FIGS. 1A and 1B. Through this, the amount of delay required for transmitting the input clock signal INCLK as the output clock signal OUTCLK in the long path between the reception unit 48 and the transfer unit 49, that is, propagation delay can be minimized.

The specific operation and configuration of the components included in each of the first driving units 401<1:K> may refer to the configuration and operation of the clock transmission circuit disclosed in FIGS. 1A to 1C.

The embodiments of the present disclosure described above are not limited by the aforementioned embodiments and the accompanying drawings, and it will be apparent to those skilled in the art to which the present disclosure pertains that various replacements, modifications, and changes can be made without departing from the technical spirit of the present disclosure.

For example, the position and the type of a logic gate and a transistor shown in the aforementioned embodiments should be differentially realized according to the polarity of an inputted signal. Furthermore, the embodiments may be combined to form additional embodiments.

What is claimed is:

1. A clock transmission circuit comprising:

a first inverter configured to invert an input clock signal received through a clock input terminal to generate an inverted clock signal, and output the inverted clock signal to a clock output terminal;

a feedback impedance circuit connected in parallel with the first inverter between the clock output terminal and the clock input terminal; and an inverter chain unit having a smaller size than the first inverter to reduce a swing level of an output clock signal, including an odd number of second inverters connected in a chain form, connected to the clock output terminal, and configured to perform a de-emphasis operation using a delay of the odd number of second inverters to reduce a rising time and a falling time of the output clock signal while inverting the inverted clock signal to generate the output clock signal and output the output clock signal to the clock output terminal.

2. The clock transmission circuit of claim 1, wherein a size of the first inverter is six times greater than a size of the second inverter.

3. The clock transmission circuit of claim 1, wherein the second inverters include at least three inverters.

4. The clock transmission circuit of claim 1, wherein an input terminal and an output terminal of the inverter chain unit are connected in common to the clock output terminal.

5. A semiconductor device comprising:

a first inverter configured to receive an input clock signal through a clock input terminal, invert the input clock signal to generate an inverted clock signal, and output the inverted clock signal to a clock output terminal, the input clock signal being input through a first interface;

a feedback impedance circuit connected in parallel with the first inverter between the clock output terminal and the clock input terminal;

an inverter chain unit having a smaller size than the first inverter to reduce a swing level of an output clock signal, including an odd number of second inverters connected in a chain form, connected to the clock output terminal, and configured to perform a de-emphasis operation using a delay of the odd number of second inverters to reduce a rising time and a falling time of the output clock signal while inverting the inverted clock signal to generate the output clock signal and output the output clock signal to the clock output terminal; and an output circuit configured to output an internal signal to a second interface in response to the output clock signal on the clock output terminal.

6. The semiconductor device of claim 5, wherein a size of the first inverter is six times greater than a size of the second inverter.

7. The semiconductor device of claim 5, wherein the second inverters include at least three inverters.

8. The semiconductor device of claim 5, wherein an input terminal and an output terminal of the inverter chain unit are connected in common to the clock output terminal.

9. The semiconductor device of claim 5, further comprising:

an internal signal generation unit configured to generate the internal signal by performing a set operation, wherein the output circuit synchronizes the internal signal to a predetermined edge of the output clock signal, and outputs the synchronized internal signal to the second interface.

10. A clock transmission circuit comprising:

a first node and a second node with a set physical distance therebetween; and a transmission unit including first driving units and second driving units that are alternatively connected to each other in a chain form between the first node and the second node, and configured to transmit a clock signal through the first driving units and the second driving units, wherein each of the first driving units comprises:

a first inverter configured to invert a first input signal received through a first input terminal to generate an inverted first input signal, and output the inverted first input signal to a first output terminal;

a feedback impedance circuit connected in parallel with the first inverter between the first output terminal and the first input terminal; and an inverter chain unit having a smaller size than the first inverter to reduce a swing level of a first output signal, including an odd number of second inverters connected in a chain form, connected to the first output terminal, and configured to perform a de-emphasis operation using a delay of the odd number of second inverters to reduce a rising time and falling time of the first output signal while inverting the inverted first input signal to generate the first output signal and output the first output signal to the first output terminal, wherein each of the second driving units comprises:

a third inverter configured to invert a second input signal received through a second input terminal to generate an inverted first input signal and output the inverted second input signal to a second output terminal.

11. The clock transmission circuit of claim 10, wherein the transmission unit transmits the clock signal through the first driving units in an odd-numbered order and the second driving units in an even-numbered order that are connected in a chain form between the first node and the second node.

12. The clock transmission circuit of claim 10, wherein the transmission unit transmits the clock signal through the first driving units in an even-numbered order and the second driving units in an odd-numbered order that are connected in a chain form between the first node and the second node.

13. The clock transmission circuit of claim 10, wherein a size of the first inverter is six times greater than a size of the second inverter, and is equal to a size of the third inverter.

14. The clock transmission circuit of claim 10, wherein the second inverters include at least three inverters.

15. The clock transmission circuit of claim 10, wherein an input terminal and an output terminal of the inverter chain unit are connected in common to the first output terminal.

16. A semiconductor device comprising:

a reception unit configured to receive a clock signal input through a first interface;

a transfer unit configured to transfer an internal signal to a second interface in response to the clock signal; and a transmission unit including first driving units and second driving units that are alternately connected to each other in a chain form, and configured to transmit the clock signal received from the reception unit to the transfer unit, wherein each of the first driving units comprises:

a first inverter configured to invert a first input signal received through a first input terminal to generate an inverted first input signal, and output the inverted first input signal to a first output terminal;

a feedback impedance circuit connected in parallel with the first inverter between the first output terminal and the first input terminal; and an inverter chain unit having a smaller size than the first inverter to reduce a swing level of a first output signal, including an odd number of second inverters connected in a chain form, connected to the first output terminal, and configured to perform a de-emphasis operation using a delay of the odd number of second inverters to reduce a rising time and falling time of the first output signal while inverting the inverted first input signal to generate the first output signal and output the first output signal to the first output terminal, wherein each of the second driving units comprises:

a third inverter configured to invert a second input signal received through a second input terminal to generate an inverted first input signal and output the inverted second input signal to a second output terminal.

17. The semiconductor device of claim 16, wherein the transmission unit transmits the clock signal through the first driving units in an even-numbered order and the second driving units in an odd-numbered order that are connected in a chain form between the reception unit and the transfer unit.

18. The semiconductor device of claim 16, wherein the transmission unit transmits the clock signal through the first driving units in an odd-numbered order and the second driving units in an even-numbered order that are connected in a chain form between the reception unit and the transfer unit.

19. The semiconductor device of claim 16, wherein a size of the first inverter is six times greater than a size of the second inverter, and is equal to a size of the third inverter.

20. The semiconductor device of claim 16, wherein the second inverters include at least three inverters.

21. The semiconductor device of claim 16, wherein an input terminal and an output terminal of the inverter chain unit are connected in common to the first output terminal.

22. The semiconductor device of claim 16, further comprising:

an internal signal generation unit configured to generate the internal signal by performing a set operation, wherein the transfer unit synchronizes the internal signal to a predetermined edge of the clock signal, and outputs the synchronized internal signal to the second interface.

* * * * *